United States Patent
Lv et al.

(10) Patent No.: US 9,768,200 B2
(45) Date of Patent: Sep. 19, 2017

(54) TFT BACKPLATE STRUCTURE AND MANUFACTURE METHOD THEREOF

(71) Applicant: Shenzhen China Star Optoelectronics Technology Co., Ltd., Shenzhen, Guangdong (CN)

(72) Inventors: Xiaowen Lv, Guangdong (CN); Chihyuan Tseng, Guangdong (CN); Chihyu Su, Guangdong (CN); Hejing Zhang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 30 days.

(21) Appl. No.: 14/426,153

(22) PCT Filed: Sep. 19, 2014

(86) PCT No.: PCT/CN2014/086891
§ 371 (c)(1),
(2) Date: Mar. 4, 2015

(87) PCT Pub. No.: WO2016/033840
PCT Pub. Date: Mar. 10, 2016

(65) Prior Publication Data
US 2016/0254282 A1  Sep. 1, 2016

(30) Foreign Application Priority Data

Sep. 2, 2014 (CN) .......................... 2014 1 0444171

(51) Int. Cl.
*H01L 27/12* (2006.01)
*H01L 29/423* (2006.01)
(Continued)

(52) U.S. Cl.
CPC .......... *H01L 27/1237* (2013.01); *H01L 21/77* (2013.01); *H01L 27/12* (2013.01);
(Continued)

(58) Field of Classification Search
CPC ............. H01L 27/1237; H01L 27/1225; H01L 27/127; H01L 27/1288; H01L 27/14609;
(Continued)

(56) References Cited

U.S. PATENT DOCUMENTS

2005/0242745 A1* 11/2005 Jung .................... G09G 3/3233
  315/169.3
2007/0045628 A1* 3/2007 Kim .................. H01L 29/78696
  257/66

(Continued)

OTHER PUBLICATIONS

Robertson High dielectric constant oxides. Eur. Phys. J. Appl. Phys. 28, pp. 265-291 (2004).*

*Primary Examiner* — Galina Yushina
(74) *Attorney, Agent, or Firm* — Andrew C. Cheng

(57) ABSTRACT

A TFT backplate structure and a manufacture method thereof are provided. The TFT backplate structure includes a switch TFT (T1) and a drive TFT (T2). The switch TFT (T1) is constructed by a first source electrode/a first drain electrode (61), a first gate electrode (21), and a first etching stopper layer (51), a first semiconductor layer (41), a first gate isolation layer (31) sandwiched in between. The drive TFT (T2) is constructed by a second source electrode/a second drain electrode (62), a second gate electrode (22), and a second etching stopper layer (52), a second semiconductor layer (42), a second gate isolation layer (32) sandwiched in between. The materials or the thicknesses of the first gate isolation layer (31) and the second gate isolation layer (32) are different. Accordingly, the electrical properties of the switch TFT (T1) and the drive TFT (T2) are different.

1 Claim, 7 Drawing Sheets

(51) Int. Cl.
*H01L 21/77* (2017.01)
*H01L 29/786* (2006.01)
*H01L 27/32* (2006.01)

(52) U.S. Cl.
CPC ........ *H01L 27/127* (2013.01); *H01L 27/1225* (2013.01); *H01L 27/1288* (2013.01); *H01L 29/42384* (2013.01); *H01L 29/7869* (2013.01); *H01L 29/78606* (2013.01); *H01L 27/3262* (2013.01); *H01L 2029/42388* (2013.01)

(58) Field of Classification Search
CPC ... H01L 27/32; H01L 27/288; H01L 27/3241; H01L 27/3244; H01L 29/7869; H01L 29/8608; H01L 29/42384; H01L 2029/42388; H01L 2227/32
See application file for complete search history.

(56) References Cited

U.S. PATENT DOCUMENTS

| | | | | |
|---|---|---|---|---|
| 2008/0258141 | A1* | 10/2008 | Park | H01L 29/78618 257/43 |
| 2011/0124138 | A1* | 5/2011 | Takahara | H01L 27/1225 438/34 |
| 2015/0145030 | A1* | 5/2015 | Meiser | H01L 29/7825 257/334 |

* cited by examiner

TFT BACKPLATE STRUCTURE AND MANUFACTURE METHOD THEREOF

CROSS REFERENCE TO RELATED APPLICATIONS

This application is a national phase of PCT application PCT/CN2014/086891, filed on Sep. 19, 2014, which claims the priority of Chinese Patent Application No. 201410444171.3 filed on Sep. 2, 2014.

FIELD OF THE INVENTION

The present invention relates to a display technology field, and more particularly to a TFT backplate structure and a manufacture method thereof.

BACKGROUND OF THE INVENTION

A flat panel display possesses advantages of being ultra thin, power saved and radiation free and has been widely utilized. Present flat panel displays mainly comprise a LCD (Liquid Crystal Display) or an OLED (Organic Light Emitting Display).

An Organic Light Emitting Diodes Display possesses outstanding properties of self-illumination, no required back light, high contrast, being ultra thin, wide view angle, fast response, being applicable for flexible panel, wide usage temperature range, simple structure and manufacture process and etc., therefore, it is considered to be a new applicable technology for the next generation flat panel display.

Thin Film transistors (TFT) are important components of a flat panel display which can be formed on a glass substrate or a plastic substrate. Generally, the thin film transistors are employed as switch elements and driving elements utilized such as LCDs, OLEDs, Electrophoresis Displays (EPD).

The oxide semiconductor TFT technology is the most popular skill at present. Because oxide semiconductor has higher electron mobility and simpler manufacture process in comparison with the Low Temperature Poly-silicon (LTPS) and has higher compatibility with the amorphous silicon process. Therefore, the oxide semiconductor has been widely utilized in the skill field of large scale Organic Light Emitting Display and has the great opportunity of application development.

In the present oxide semiconductor TFT backplate structure, the Etching Stopper Layer structure, the Back Channel Etching structure, the Coplanar structure and et cetera are well developed and provide more applications. These structures have respective advantages and drawbacks of their own. For example, the Etching Stopper Layer structure comprises the etching stopper layer to protect the oxide semiconductor layer. The stability is better but the manufacture of the etching stopper layer needs one extra mask and the coupling capacitance is larger which go against the promotion of the yield and the decrease of the manufacture cost; the Back Channel Etching structure and the Coplanar structure can eliminate one mask in the manufacture process to reduce the manufacture cost and the corresponding coupling capacitance can be smaller which provide higher competitiveness and development prospects. However, the stabilities of these two structures have yet to be promoted.

Furthermore, the present oxide semiconductor TFT backplate generally comprises a switch TFT and a drive TFT. In the traditional process, the switch TFT and the drive TFT are formed by the same manufacture process in general. Therefore, the switch TFT and the drive TFT have the same structure and the same electrical properties, such as the same conducting current (Ion), threshold voltage ($V_{th}$), subthreshold swing (S.S) and et cetera. Nevertheless, the demands of the electrical properties for the switch TFT and the drive TFT are different in practical usages. In general, the switch TFT is expected to have a smaller S.S to achieve the object of fast charge and discharge. The drive TFT is expected to have a slightly larger S.S for controlling the current and the grey scale more precisely.

SUMMARY OF THE INVENTION

An objective of the present invention is to provide a TFT backplate structure, capable of differentiating the switch TFT and the drive TFT to make the switch TFT and the drive TFT have different electrical properties and raise the performance of the TFT backplate.

Another objective of the present invention is to provide a manufacture method of a TFT backplate structure, capable of manufacturing the switch TFT and the drive TFT have different electrical properties thereby to raise the performance of the TFT backplate.

For realizing the aforesaid objective, the present invention first provides a TFT backplate structure, comprising a substrate, a first gate electrode and a second gate electrode on the substrate with a distance in between, a first gate isolation layer on the substrate and the first gate electrode, a second gate isolation layer on the substrate and the second gate electrode, a first oxide semiconductor layer right over the first gate electrode and on the first gate isolation layer, a second oxide semiconductor layer right over the second gate electrode and on the second gate isolation layer, a first etching stopper layer on the first oxide semiconductor layer, a second etching stopper layer on the second oxide semiconductor layer, a first source electrode/a first drain electrode on the first gate isolation layer and the first etching stopper layer, a second source electrode/a second drain electrode on the second gate isolation layer and the second etching stopper layer, a protective layer on the first source electrode/the first drain electrode and the second source electrode/the second drain electrode, a pixel electrode on the protective layer; the first source electrode/the first drain electrode are connected to the first oxide semiconductor layer and the second gate electrode, and the second source electrode/the second drain electrode are connected to the second oxide semiconductor layer, the pixel electrode is connected to the second source electrode/the second drain electrode; the first etching stopper layer, the first semiconductor layer, the first gate isolation layer are disposed between the first source electrode/the first drain electrode and the first gate electrode, and all the above elements create a switch TFT; the second etching stopper layer, the second semiconductor layer, the second gate isolation layer are disposed between the second source electrode/the second drain electrode and the second gate electrode, and all the above elements create a drive TFT, and structures of the first gate isolation layer and the second gate isolation layer are different, and electrical properties of the switch TFT and the drive TFT are different.

A material of the first gate isolation layer and a material of the second gate isolation layer are different.

When a material of the first gate isolation layer is SiOx, a material of the second gate isolation layer is $Al_2O_3$; when a material of the first gate isolation layer is SiOx, a material of the second gate isolation layer is SiNx; and when a material of the first gate isolation layer is Al$_2$O$_3$, a material of the second gate isolation layer is a mixture of SiNx and SiOx.

A thickness of the first gate isolation layer and a thickness of the second gate isolation layer are different.

A thickness of the first gate isolation layer is 2000 A, and a thickness of the second gate isolation layer is 4000 A.

The present invention further provides a manufacture method of a TFT backplate structure, comprising steps of:

Step 1, providing a substrate, and deposing a first metal film on the substrate, and patterning the first metal film to form a first gate electrode and a second gate electrode with a distance in between;

Step 2, forming a first gate isolation layer on the on the substrate and the first gate electrode, and forming a second gate isolation layer on the substrate and the second gate electrode;

Structures of the first gate isolation layer and the second gate isolation layer are different;

Step 3, deposing an oxide semiconductor film on the first and second gate isolation layers, and patterning the oxide semiconductor film to form a first oxide semiconductor layer and a second oxide semiconductor layer;

Step 4, deposing an etching stopper film on the first and second oxide semiconductor layers and the first and second gate isolation layers, and patterning the etching stopper film to form a first etching stopper layer and a second etching stopper layer;

Step 5, deposing a second metal film on the first and second etching stopper layers, and the first and second gate isolation layers, and patterning the second metal film to form a first source electrode/a first drain electrode, and a second source electrode/a second drain electrode;

The first source electrode/the first drain electrode are connected to the first oxide semiconductor layer and the second gate electrode, and the second source electrode/the second drain electrode are connected to the second oxide semiconductor layer;

Step 6, forming a protective layer on the first source electrode/the first drain electrode, and the second source electrode/the second drain electrode;

Step 7, forming a pixel electrode on the protective layer;

The pixel electrode is connected to the second source electrode/the second drain electrode.

In step 2, two masks are employed to respectively form the first gate isolation layer and the second gate isolation layer, and a material of the first gate isolation layer and a material of the second gate isolation layer are different.

When a material of the first gate isolation layer is SiOx, a material of the second gate isolation layer is Al$_2$O$_3$; when a material of the first gate isolation layer is SiOx, a material of the second gate isolation layer is SiNx; and when a material of the first gate isolation layer is Al$_2$O$_3$, a material of the second gate isolation layer is a mixture of SiNx and SiOx.

In step 2, a half tone mask is employed to form the first gate isolation layer and the second gate isolation layer, and a thickness of the first gate isolation layer and a thickness of the second gate isolation layer are different.

A thickness of the first gate isolation layer is 2000 A, and a thickness of the second gate isolation layer is 4000 A.

The benefits of the present invention are: according to the TFT backplate structure of the present invention, by arranging the first and second gate isolation layers having different materials or different thicknesses for differentiating the switch TFT and the drive TFT to make that the switch TFT possesses a smaller subthreshold swing for fast charge and discharge, and the drive TFT possesses a larger subthreshold swing for more precisely controlling the current and the grey scale. Accordingly, the switch TFT and the drive TFT have different electrical properties to raise the performance of the TFT backplate. According to the manufacture method of the TFT backplate structure, the first and second gate isolation layers are manufactured with different materials or different thicknesses so that the switch TFT and the drive TFT have different electrical properties to raise the performance of the TFT backplate.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

In order to better understand the characteristics and technical aspect of the invention, please refer to the following detailed description of the present invention is concerned with the diagrams.

Figure 1:
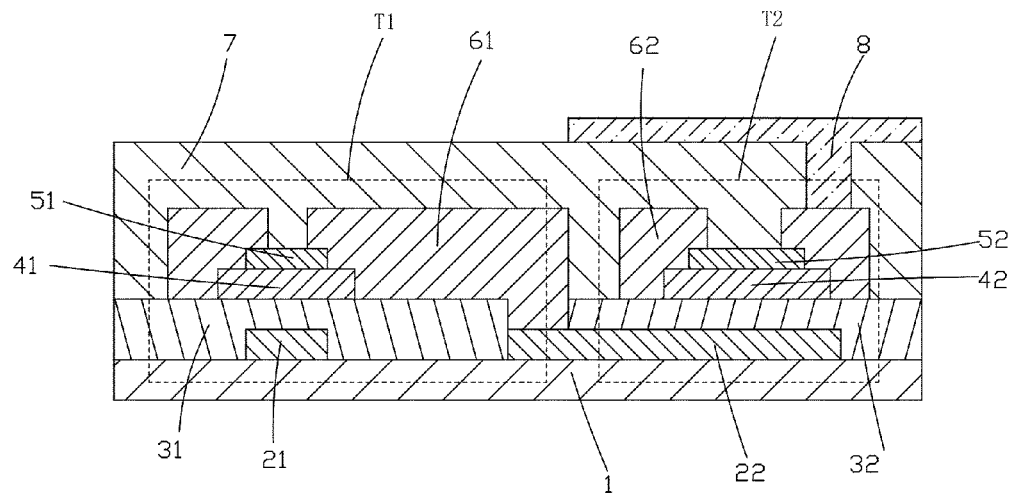
FIG. 1 is a sectional diagram of a TFT backplate structure according to the first embodiment of the present invention.

Please refer to FIG. 1, which is the first embodiment of the TFT backplate structure according to the present invention. The TFT backplate structure comprises comprising a substrate 1, a first gate electrode 21 and a second gate electrode 22 on the substrate 1 with a distance in between, a first gate isolation layer 31 on the substrate 1 and the first gate electrode 21, a second gate isolation layer 32 on the substrate 1 and the second gate electrode 22, a first oxide semiconductor layer 41 right over the first gate electrode 21 and on the first gate isolation layer 31, a second oxide semiconductor layer 42 right over the second gate electrode 22 and on the second gate isolation layer 32, a first etching stopper layer 51 on the first oxide semiconductor layer 41, a second etching stopper layer 52 on the second oxide semiconductor layer 42, a first source electrode/a first drain electrode 61 on the first gate isolation layer 31 and the first etching stopper layer 51, a second source electrode/a second drain electrode 62 on the second gate isolation layer 32 and the second etching stopper layer 52, a protective layer 7 on the first source electrode/the first drain electrode 61 and the second source electrode/the second drain electrode 62, a pixel electrode 8 on the protective layer 7.

Both the first gate electrode 21 and the second gate electrode 22 are formed by patterning the same first metal film. Both the first oxide semiconductor layer 41 and the second oxide semiconductor layer 42 are formed by patterning the same oxide semiconductor film. Both the first etching stopper layer 51 and the second etching stopper layer 52 are formed by patterning the same etching stopper film. The first source electrode/the first drain electrode 61 and the second source electrode/the second drain electrode 62 are formed by patterning the same second metal film. The structures of the first gate isolation layer 31 and the second gate isolation layer 32 are different.

The first source electrode/the first drain electrode 61 are connected to the first oxide semiconductor layer 41 and the second gate electrode 22; the second source electrode/the second drain electrode 62 are connected to the second oxide semiconductor layer 42; the pixel electrode 8 is connected to the second source electrode/the second drain electrode 62.

The first source electrode/the first drain electrode 61, the first gate electrode 21, and the first etching stopper layer 51, the first semiconductor layer 41, the first gate isolation layer 31 sandwiched in between construct a switch TFT T1; the second source electrode/the second drain electrode 62, the second gate electrode 22, and the second etching stopper layer 52, the second semiconductor layer 42, the second gate isolation layer 32 sandwiched in between construct a drive TFT T2x.

In the first embodiment, the thickness of the first gate isolation layer 31 and the thickness of the second gate isolation layer 32 are the same but the materials thereof are different. The first gate isolation layer 31 and the second gate isolation layer 32 require respective one mask for formation. Specifically, a material of the first gate isolation layer 31 is SiOx, and a material of the second gate isolation layer 32 is Al$_2$O$_3$; or a material of the first gate isolation layer 31 is SiOx, and a material of the second gate isolation layer 32 is SiNx; or a material of the first gate isolation layer 31 is Al$_2$O$_3$, and a material of the second gate isolation layer 32 is a mixture of SiNx and SiOx.

Furthermore, both the first and second oxide semiconductor layers 41, 42 are Indium Gallium Zinc Oxide (IGZO) semiconductor layers. The pixel electrode 8 is an Indium Tin Oxide (ITO) pixel electrode.

Differentiation exists between the switch TFT T1 and the drive TFT T2 to make the electrical properties of the switch TFT T1 and the drive TFT T2 different because the material of the first gate isolation layer 31 and the material of the second gate isolation layer 32 are different: the switch TFT T1 possesses a smaller subthreshold swing S.S for fast charge and discharge; the drive TFT T2 possesses a relatively larger subthreshold swing S.S for more precisely controlling the current and the grey scale. Therefore, the TFT backplate structure can meet the demands of the practical usage to raise the performance of the TFT backplate.

Figure 2:
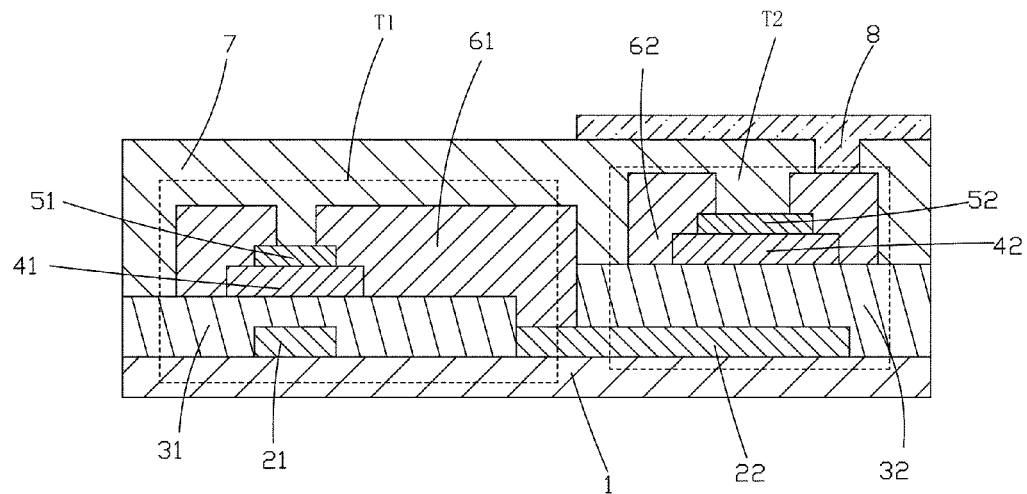
FIG. 2 is a sectional diagram of a TFT backplate structure according to the second embodiment of the present invention.

Please refer to FIG. 2, which is the second embodiment of the TFT backplate structure according to the present invention. The difference of the second embodiment from the first embodiment is that the material of the first gate isolation layer 31 and the material of the second gate isolation layer 32 are the same but the thicknesses thereof are different. The first gate isolation layer 31 and the second gate isolation layer 32 merely require a half tone mask for formation. Specifically, a thickness of the first gate isolation layer 31 is 2000 A, and a thickness of the second gate isolation layer 32 is 4000 A. Other figures are the same as the first embodiment. The repeated description is omitted here.

Figure 3:
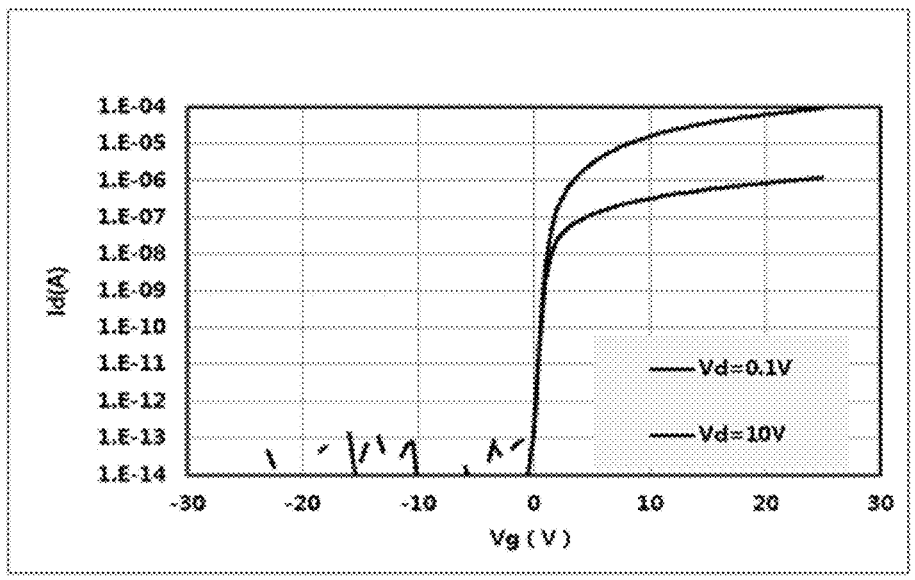
FIG. 3 is an electrical property diagram of a switch TFT in the second embodiment of the present invention.
Figure 4:
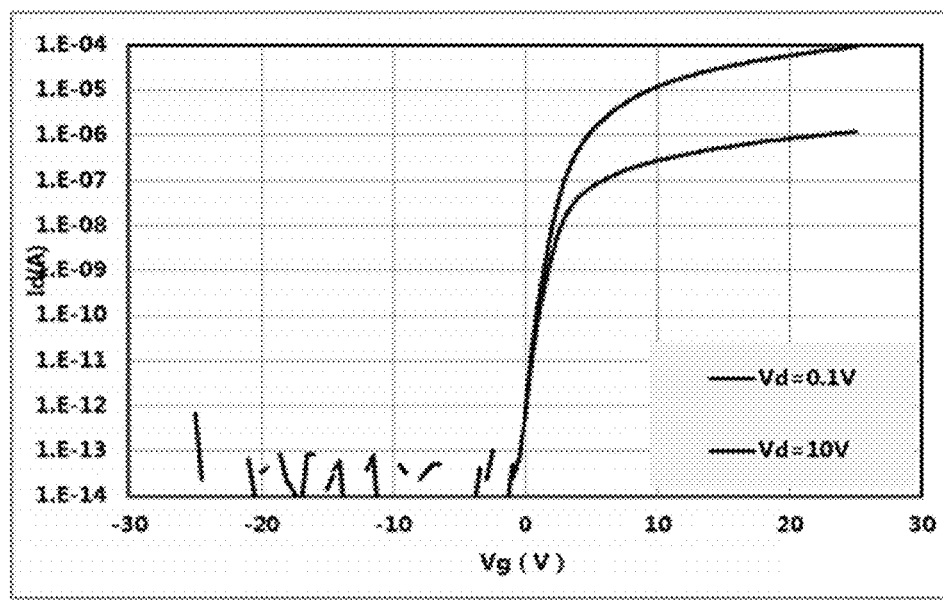
FIG. 4 is an electrical property diagram of a drive TFT in the second embodiment of the present invention.

As shown in FIG. 3 and FIG. 4, regarding the aforesaid embodiment, the thickness of the first gate isolation layer 31 constructing the switch TFT T1 is 200 A, and the subthreshold swing S.S of the switch TFT T1 is 0.1; the thickness of second gate isolation layer 32 constructing the drive TFT T2 is 4000 A, and the subthreshold swing S.S of the drive TFT T2 is larger than 0.4. Obviously, obvious differentiation exists between the switch TFT T1 and the drive TFT T2. The electrical properties of the switch TFT T1 and the drive TFT T2 are obviously different: the switch TFT T1 possesses a smaller subthreshold swing S.S for fast charge and discharge; the drive TFT T2 possesses a relatively larger subthreshold swing S.S for more precisely controlling the current and the grey scale. Therefore, the TFT backplate structure can meet the demands of the practical usage to raise the performance of the TFT backplate.

Figure 5:
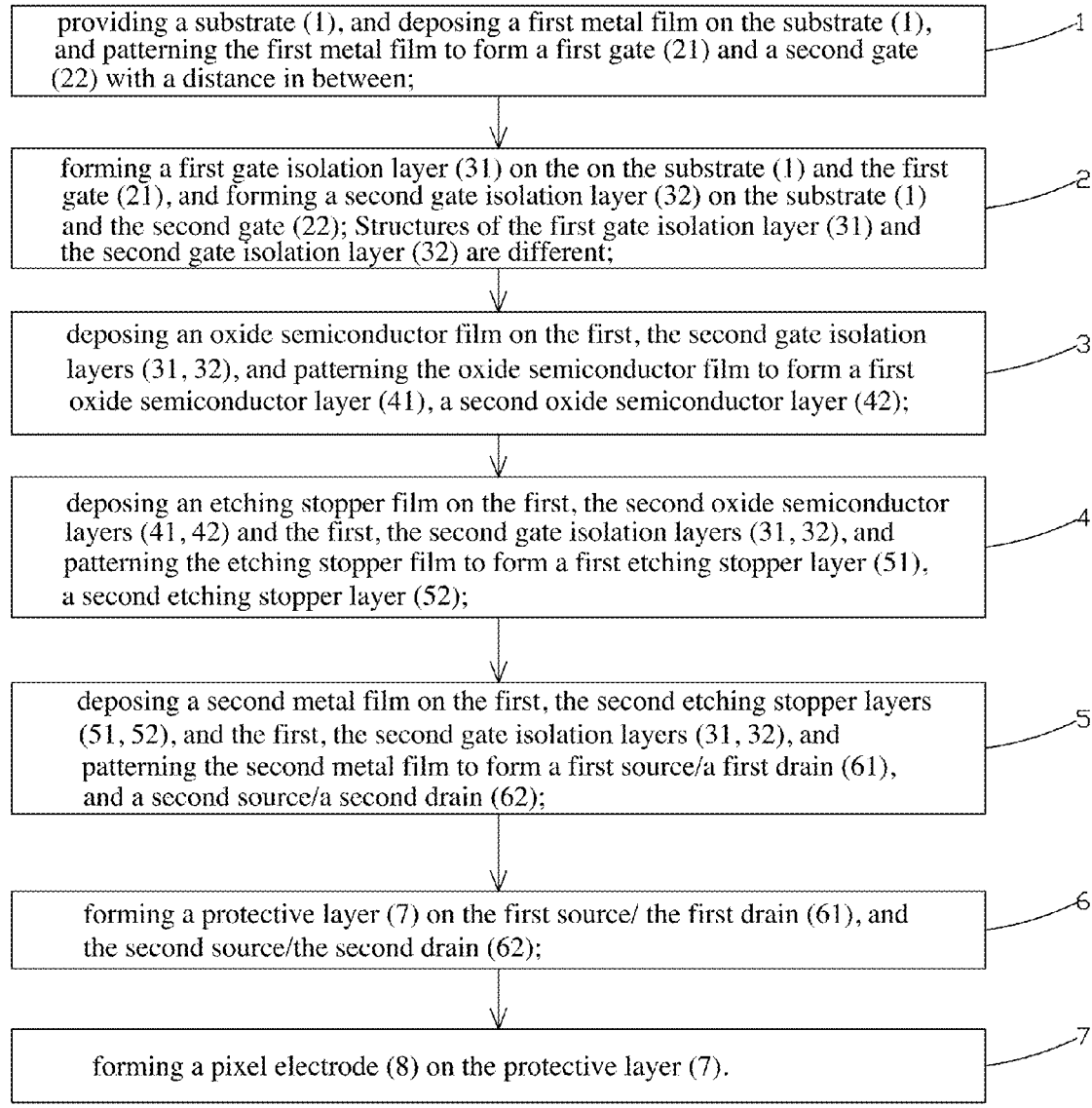
FIG. 5 is a flowchart of a manufacture method of a TFT backplate structure according to the present invention.
Figure 6:
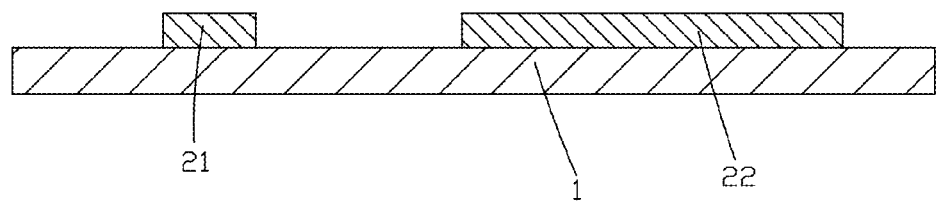
FIG. 6 is a diagram of step 1 of the manufacture method of the TFT backplate structure according to the present invention.

Please refer to FIG. 5. The present invention further provides a manufacture method of a TFT backplate structure, comprising steps of:

Step 1, as shown in FIG. 6, providing a substrate 1, and deposing a first metal film on the substrate 1, and patterning the first metal film to form a first gate electrode 21 and a second gate electrode 22 with a distance in between.

Step 2, forming a first gate isolation layer 31 on the on the substrate 1 and the first gate electrode 21, and forming a second gate isolation layer 32 on the substrate 1 and the second gate electrode 22; structures of the first gate isolation layer 31 and the second gate isolation layer 32 are different.

Figure 7:
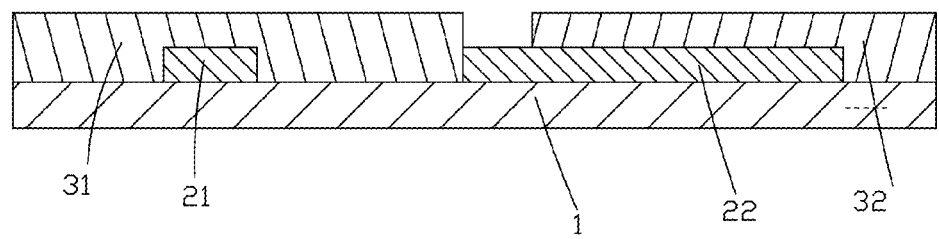
FIG. 7 is a diagram of one embodiment of step 2 in the manufacture method of the TFT backplate structure according to the present invention.

Specifically, the implement of step 2 can be shown in FIG. 7. Two masks are employed to respectively form the first gate isolation layer 31 and the second gate isolation layer 32, and a material of the first gate isolation layer 31 and a material of the second gate 32 isolation layer are different. Furthermore, the material of the first gate isolation layer 31 is SiOx, and the material of the second gate isolation layer 32 is Al$_2$O$_3$; or the material of the first gate isolation layer 31 is SiOx, and the material of the second gate isolation layer 32 is SiNx; or the material of the first gate isolation layer 31 is Al$_2$O$_3$, and the material of the second gate isolation layer 32 is mixture of SiNx and SiOx.

Figure 8:
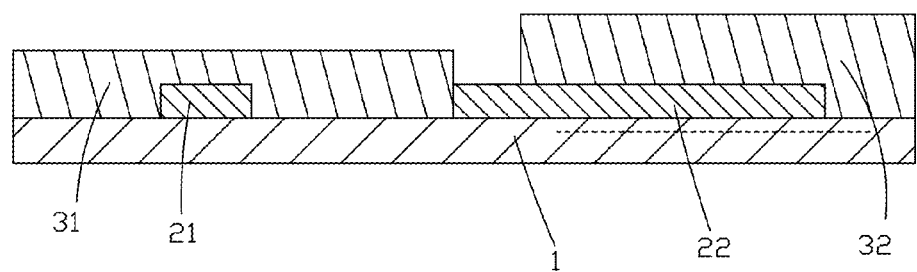
FIG. 8 is a diagram of another embodiment of step 2 in the manufacture method of the TFT backplate structure according to the present invention.

Alternatively, the implement of step 2 can be shown in FIG. 8. A half tone mask is employed to form the first gate isolation layer 31 and the second gate isolation layer 32, and a thickness of the first gate isolation layer 31 and a thickness of the second gate isolation layer 32 are different. Furthermore, a thickness of the first gate isolation layer is 2000 A, and a thickness of the second gate isolation layer is 4000 A.

Figure 9:
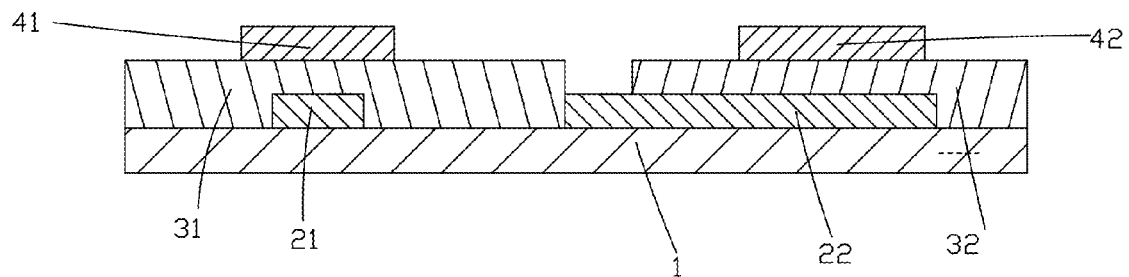
FIG. 9 is a diagram of step 3 of the manufacture method of the TFT backplate structure according to the present invention.

Step 3, as shown in FIG. 9, deposing an oxide semiconductor film on the first and second gate isolation layers 31, 32, and patterning the oxide semiconductor film to form a first oxide semiconductor layer 41 and a second oxide semiconductor layer 42.

Specifically, both the first, the and second oxide semiconductor layers 41, 42 are IGZO semiconductor layers.

Figure 10:
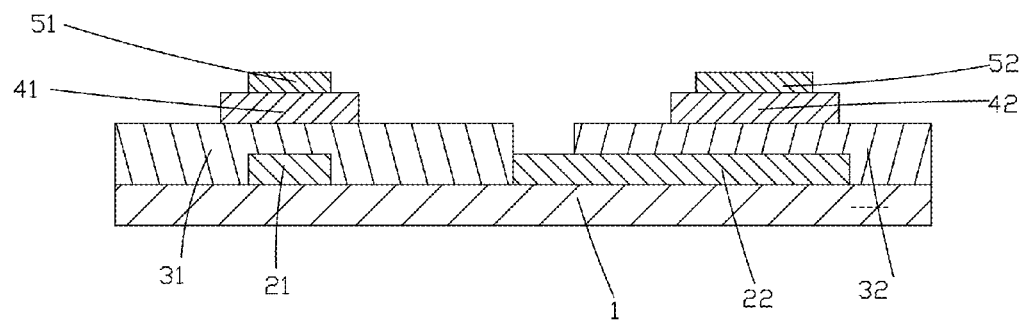
FIG. 10 is a diagram of step 4 of the manufacture method of the TFT backplate structure according to the present invention.

Step 4, as shown in FIG. 10, deposing an etching stopper film on the first and second oxide semiconductor layers 41, 42 and the first and second gate isolation layers 31, 32, and patterning the etching stopper film to form a first etching stopper layer 51 and a second etching stopper layer 52.

Figure 11:
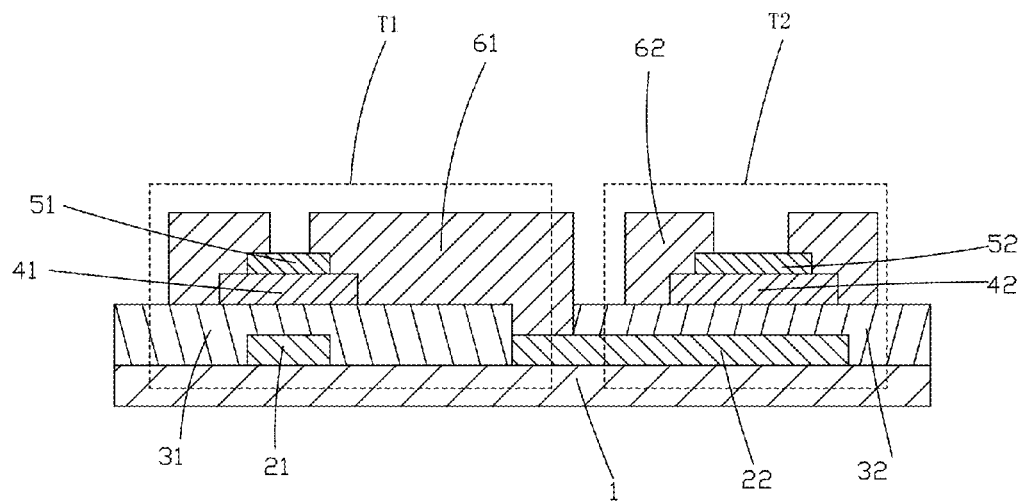
FIG. 11 is a diagram of step 5 of the manufacture method of the TFT backplate structure according to the present invention.

Step 5, as shown in FIG. 11, deposing a second metal film on the first and second etching stopper layers 51, 52, and the first and second gate isolation layers 31, 32, and patterning the second metal film to form a first source electrode/a first drain electrode 61, and a second source electrode/a second drain electrode 62.

The first source electrode/the first drain electrode 61 are connected to the first oxide semiconductor layer 41 and the second gate electrode 22, and the second source electrode/the second drain electrode 62 are connected to the second oxide semiconductor layer 42.

After step 5 is accomplished, the first etching stopper layer 51, the first semiconductor layer 41, and the first gate isolation layer 31 are disposed between the first source electrode/the first drain electrode 61 and the first gate electrode 21, and all the above elements create a switch TFT T1; and the second etching stopper layer 52, the second semiconductor layer 42, and the second gate isolation layer 32 are disposed between the second source electrode/the second drain electrode 62 and the second gate electrode 22, and all the above elements create a drive TFT.

Figure 12:
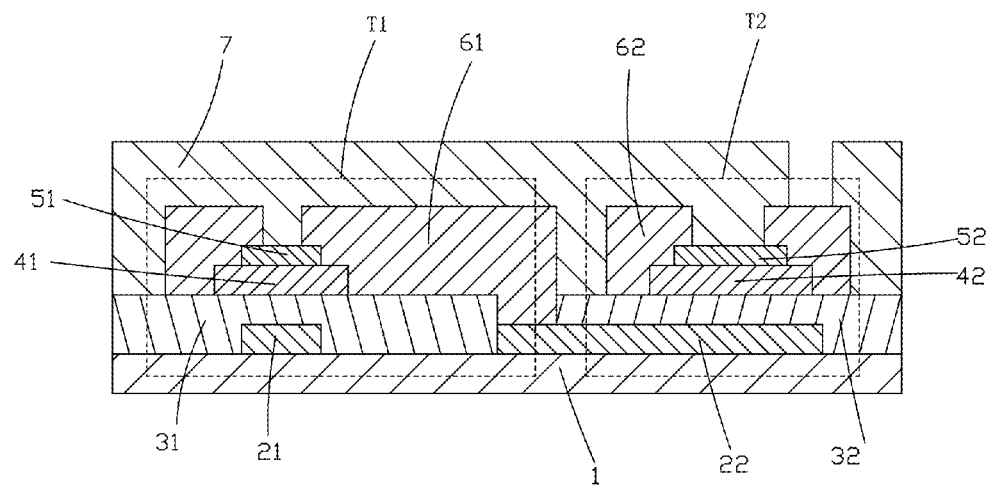
FIG. 12 is a diagram of step 6 of the manufacture method of the TFT backplate structure according to the present invention.

Step 6, shown in FIG. 12, forming a protective layer 7 on the first source electrode/the first drain electrode 61, and the second source electrode/the second drain electrode 62.

Figure 13:
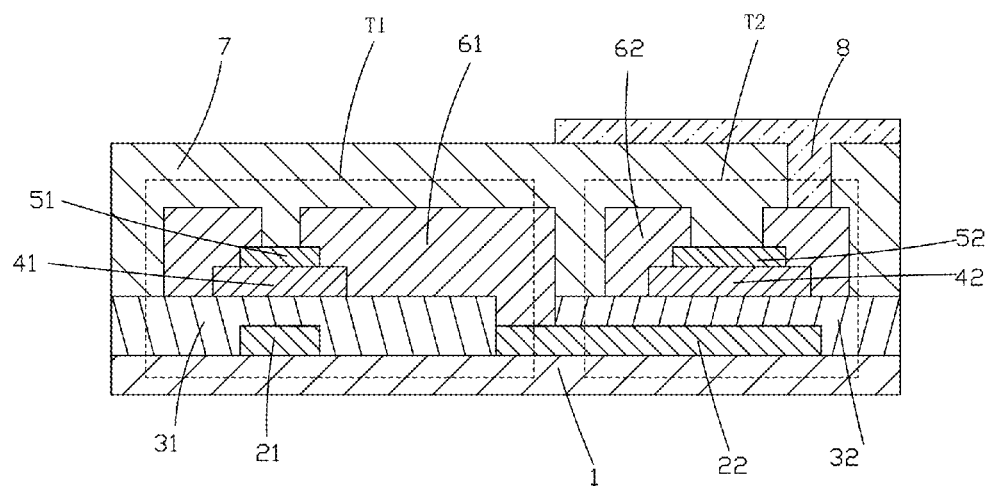
FIG. 13 is a diagram of step 7 of the manufacture method of the TFT backplate structure according to the present invention.

Step 7, shown in FIG. 13, forming a pixel electrode 8 on the protective layer 7.

The pixel electrode 8 is connected to the second source electrode/the second drain electrode 62.

Specifically, the pixel electrode 8 is an ITO pixel electrode.

Differentiation exists between the switch TFT T1 and the drive TFT T2 to make the electrical properties of the switch TFT T1 and the drive TFT T2 different because the material of the first gate isolation layer 31 and the material of the second gate isolation layer 32 are different according to the method: the switch TFT T1 possesses a smaller subthreshold swing S.S for fast charge and discharge; the drive TFT T2 possesses a relatively larger subthreshold swing S.S for more precisely controlling the current and the grey scale. Therefore, the TFT backplate structure can meet the demands of the practical usage to raise the performance of the TFT backplate.

In conclusion, according to the TFT backplate structure of the present invention, by arranging the first and second gate isolation layers having different materials or different thicknesses for differentiating the switch TFT and the drive TFT to make that the switch TFT possesses a smaller subthreshold swing for fast charge and discharge, and the drive TFT possesses a larger subthreshold swing for more precisely controlling the current and the grey scale. Accordingly, the switch TFT and the drive TFT have different electrical properties to raise the performance of the TFT backplate. According to the manufacture method of the TFT backplate structure, the first and second gate isolation layers are manufactured with different materials or different thicknesses so that the switch TFT and the drive TFT have different electrical properties to raise the performance of the TFT backplate.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A thin-film transistor (TFT) backplate structure, comprising a substrate, a first gate electrode and a second gate electrode on the substrate with a distance in between, a first gate isolation layer on the substrate and the first gate electrode, a second gate isolation layer on the substrate and the second gate electrode, a first oxide semiconductor layer right over the first gate electrode and on the first gate isolation layer, a second oxide semiconductor layer right over the second gate electrode and on the second gate isolation layer, a first etching stopper layer on the first oxide semiconductor layer, a second etching stopper layer on the second oxide semiconductor layer, a first source electrode and a first drain electrode on the first gate isolation layer and the first etching stopper layer, a second source electrode and a second drain electrode on the second gate isolation layer and the second etching stopper layer, a protective layer on the first source electrode and the first drain electrode and the second source electrode and the second drain electrode, a pixel electrode on the protective layer; wherein the first source electrode and the first drain electrode are connected to the first oxide semiconductor layer and one of the first source and the first drain electrode is connected to the second gate electrode, and the second source electrode and the second drain electrode are connected to the second oxide semiconductor layer, and the pixel electrode is connected to one of the second source electrode and the second drain electrode; the first etching stopper layer, the first semiconductor layer, and the first gate isolation layer are sandwiched in between the first gate electrode and the first source and drain electrodes, and construct a switch TFT; the second etching stopper layer, the second semiconductor layer, and the second gate isolation layer are sandwiched in between the second gate electrode and the second source electrode and the second drain electrode, and construct a drive TFT, wherein structures of the first gate isolation layer and the second gate isolation layer are different by having the first gate isolation layer and the second gate isolation layer made of first and second materials, respectively, the first and second materials being different from each other, and electrical properties of the switch TFT and the drive TFT are different such that a subthreshold swing of the switch TFT is relatively small for fast charging and discharging and a subthreshold swing of the drive TFT is relatively large for precise control of an electric current and grey scale;

wherein the first and second materials are respectively $SiO_x$ and $Al_2O_3$, or alternatively, the first and second materials are respectively $SiO_x$ and $SiN_x$, or alternatively, the first and second materials are respectively $Al_2O_3$ and a mixture of $SiN_x$ and $SiO_x$.

* * * * *